(12) United States Patent
Griffin

(10) Patent No.: US 8,362,929 B2
(45) Date of Patent: Jan. 29, 2013

(54) KEYPAD AND METHOD OF ASSEMBLY OF SAME

(75) Inventor: Jason Tyler Griffin, Kitchener (CA)

(73) Assignee: Research In Motion Limited, Waterloo (CA)

( * ) Notice: Subject to any disclaimer, the term of this patent is extended or adjusted under 35 U.S.C. 154(b) by 403 days.

(21) Appl. No.: 12/751,173

(22) Filed: Mar. 31, 2010

(65) Prior Publication Data

US 2011/0241909 A1    Oct. 6, 2011

(51) Int. Cl.
*H03M 11/00*    (2006.01)

(52) U.S. Cl. .......................................... 341/22; 345/168
(58) Field of Classification Search .................. 341/22, 341/23; 345/168; 708/142
See application file for complete search history.

(56) References Cited

U.S. PATENT DOCUMENTS

| | | | |
|---|---|---|---|
| 7,015,896 B2* | 3/2006 | Levy et al. ..................... | 345/168 |
| 7,502,462 B2* | 3/2009 | Rak et al. ................. | 379/433.07 |
| 2005/0104750 A1 | 5/2005 | Tuason | |
| 2006/0018463 A1 | 1/2006 | Rak et al. | |
| 2006/0082540 A1* | 4/2006 | Prior ........................... | 345/156 |
| 2007/0030249 A1 | 2/2007 | Griffin | |

FOREIGN PATENT DOCUMENTS

| | | |
|---|---|---|
| FR | 2837940 | 10/2003 |
| FR | 2837940 A1 | 10/2003 |
| WO | 0171746 A1 | 9/2001 |
| WO | 2007121185 A1 | 10/2007 |
| WO | 2009076527 | 6/2009 |

OTHER PUBLICATIONS

European Search Report application No. 10158865.5. retrieved on Aug. 6, 2010.
Office Action mailed Oct. 3, 2012, in corresponding Canadian patent application No. 2,730,834.
Examination report mailed Oct. 24, 2012, in corresponding European patent application No. 10158865.5.

* cited by examiner

*Primary Examiner* — Brian Young
(74) *Attorney, Agent, or Firm* — Novak Druce + Quigg LLP

(57) ABSTRACT

A keypad is described herein in which the keypad can have a base surface and a plurality of keys positioned on the base surface. The plurality of keys can be made up of a first group that that is an arrangement of number keys for initiating a voice-based communication and a second group that is an arrangement of letter keys. In addition, the number keys of the first group and the letter keys of the second group are independent of one another. As an example, the number keys of the first group can be positioned on the base surface in a number of columns, and the letter keys of the second group can be positioned in areas between the number keys.

14 Claims, 7 Drawing Sheets

KEYPAD AND METHOD OF ASSEMBLY OF SAME

FIELD OF TECHNOLOGY

The subject matter herein generally relates to keypads and in particular, to keypads in mobile devices.

BACKGROUND

Manufacturers of mobile devices have dealt with a vexing issue in recent years: the expansion of the area needed to accommodate keypads with the diametrically opposed goal of shrinking the overall size of the devices. For example, many manufacturers have implemented full QWERTY-type keypads in their mobile devices. While enabling quick and efficient entry of data into the device, this type of keypad requires a relatively large amount of space. One way developers have solved this problem is through the introduction of slide-style mobile devices. Slide-style mobile devices, however, are complicated to manufacture.

Some mobile devices rely on keypads that have keys that share alphanumeric characters, which reduces the number of keys required for the keypad. For example, many of these keypads include a 4 rows by 3 columns ("4×3") array in which multiple letters and a single number are associated with most of the keys. To move from one letter to the next on a particular key, an operator typically presses the relevant key multiple times until the desired letter appears on the display. At this point, the operator can move onto the next letter, which may also require multiple presses of the same button. As such, the operator may be required to make numerous button presses to generate a text message or some other display of the characters on the keys. This process can be quite tedious for the operator.

BRIEF DESCRIPTION OF THE DRAWINGS

Embodiments of the present application will now be described, by way of example only, with reference to the attached Figures, wherein.

DETAILED DESCRIPTION

Figure 1A:
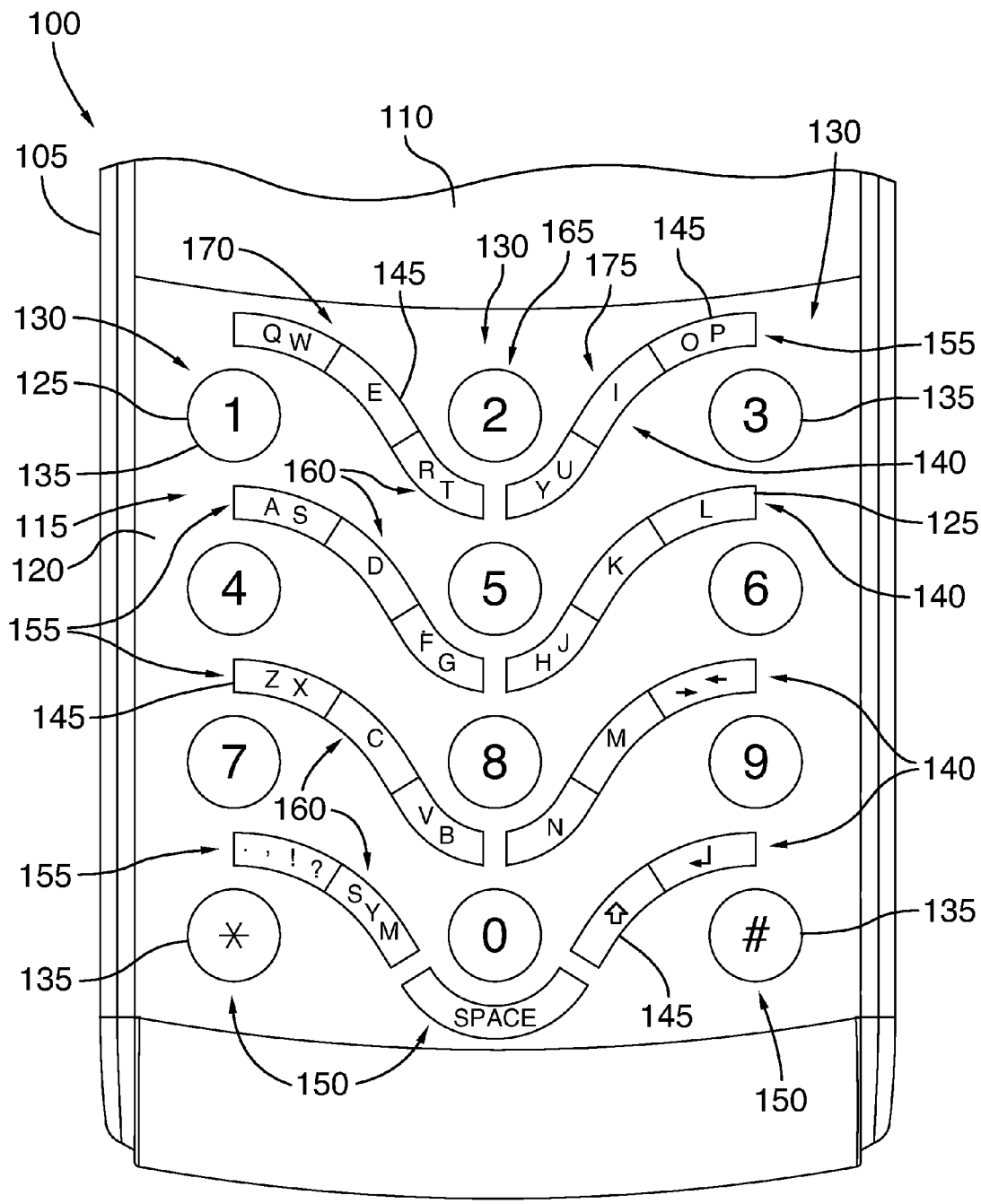
FIG. 1A illustrates an example of a mobile device having an example keypad.

It will be appreciated that for simplicity and clarity of illustration, where appropriate, reference numerals have been repeated among the different figures to indicate corresponding or analogous elements. In addition, numerous specific details are set forth in order to provide a thorough understanding of the example embodiments described herein. However, it will be understood by those of ordinary skill in the art that the example embodiments described herein can be practiced without these specific details. In other instances, methods, procedures and components have not been described in detail so as not to obscure the related relevant feature being described. Also, the description is not to be considered as limiting the scope of the example embodiments described herein.

Several definitions that apply throughout this disclosure will now be presented. The word "coupled" is defined as connected, whether directly or indirectly through intervening components and is not necessarily limited to physical connections. The term "mobile device" is defined as any electronic device that is capable of at least accepting information entries or commands from a user. Examples of mobile devices will be presented below. The term "keypad" is defined as a user interface component that can accept entries from an operator for purposes of causing a corresponding action to occur in another component. A "key" is defined as a part of a keypad that is configured to receive, whether directly or indirectly, an object from an operator, including a finger or a stylus, to cause the corresponding action referenced above. Further definitions will be presented below.

It is desirable to implement full QWERTY keypads in mobile devices and to limit the amount of mode switching between, for example, a phone mode for input of telephone numbers and a text mode for composing text messages. It is also desirable, however, to minimize the expansion of the size of mobile devices. A keypad that provides a solution to these competing interests is presented herein.

The keypad can include a base surface and a plurality of keys positioned on the base surface. In one arrangement, the plurality of keys can be comprised of a first group that is an arrangement of number keys for at least initiating a voice-based communication and a second group that is an arrangement of letter keys. The number keys of the first group and the letter keys of the second group can be independent of one another. In another arrangement, the number keys of the first group can be positioned on the base surface in a number of columns, and the letter keys of the second group can be positioned in areas between the number keys. This configuration can enable independent operation of a number keypad and a keypad for text entry, like a QWERTY arrangement, with a minimal amount of required space.

Referring to FIG. 1A, an example of a mobile device 100 is shown. In one arrangement, the mobile device 100 includes a housing 105 and a display 110. The mobile device 100 can also have a keypad 115, the configuration of which will be explained below. Although the keypad 115 is shown as a separate component in relation to the display 110, it is understood that the keypad 115 can alternatively be a touch keypad (not shown) that can be shown on the display 110 for touch-screen entry. While in the illustrated embodiment the mobile device 100 is a handheld wireless communication device, the mobile device 100 can be any of the following: a personal digital assistant (PDA), a handheld electronic device, a non-handheld wireless communication device, a pager, a cellular phone, a cellular smart-phone, a wireless organizer, a wirelessly enabled notebook computer and the like.

The keypad 115 can include a base surface 120 and a plurality of keys 125 positioned on the base surface 120. If the keypad 115 is a touch keypad that is shown on the display 110, the base surface 120 can be the outer surface of the display 110. In this example, the keypad 115 can be assembled into the housing 105 of the mobile device 100, although the keypad 115 can be implemented in other suitable structures or components. In one embodiment, the plurality of keys 125 is comprised of a first group 130 that is an arrangement of number keys 135 for at least initiating a voice-based communication and of a second group 140 that is an arrangement of letter keys 145. Additionally, the number keys 135 of the first group 130 and the letter keys 145 of the second group 140 can be independent of one another.

In particular, when pressed or otherwise activated, the number keys 135 at least cause voice-based communications to be initiated. As such, the number keys 135 can be associated with a dialing function of the mobile device 100. The terms "voice-based communication" or "voice call" mean any communication where voice signals, whether natural or artificially generated, are transmitted from one point to another. The term "dialing function" is defined as an action or activity that is executed to initiate a voice-based communication. In addition, a "number key" is defined as a key that is marked with an insignia that identifies that a particular key is configured for use in initiating a voice-based communication. Examples of the insignia include, but are not limited to, non-negative integers and a number sign "#" (also referred to as a pound sign or an octothorpe) and an asterisk "*" (also called a star sign). It must be understood, however, that the number keys 135 are not necessarily limited to use in initiating voice calls, as they can be used during other functions or operations of the mobile device 100.

The letter keys 145 can be associated with, for example, a text entry function of the mobile device 100. The terms "text entry" or "text entry function" are defined as an action or activity that is executed to prepare a message intended to be transmitted over a communication channel. An example of text entry is the process of entering characters in a mobile device to send an e-mail or a text message through the short message service (SMS) protocol, although certainly other standards can be employed. A "letter key" is defined as a key that is marked with an insignia that identifies that a particular key is configured for text entry. An example of the insignia is the individual elements of the Latin alphabet ("a", "b", "c" or the like), although other alphabets or systems of writing can be implemented on the letter keys. Another example of the insignia includes symbols that are useful for generating e-mail or text messages, such as punctuation marks or functional markings, such as the "space" for a space bar or an arrow pointing down and left for a "return" key (not shown). Other examples of a letter key include command keys or programmable buttons, delete keys, alternate character keys or keys for shifting between capitalization states. The letter keys 145, nevertheless, can be designed to be operable in functions other than text entry.

As referenced earlier, the number keys 135 and the letter keys 145 can be independent of one another. This principle means that an operator can press or otherwise activate one or more of the number keys 135 without doing so for the letter keys 145 and vice-versa. This configuration can permit an operator to easily input numbers, or initiate telephone calls or other features using the number keys 135. Similarly, such a layout allows for efficient entry of text messages or e-mails, for example, with no or limited multi-tap.

As can be seen in FIG. 1A, the number keys 135 of the first group 130 can be positioned on the base surface 120 in a number of columns 150, and the letter keys 145 of the second group 140 can be positioned in areas between the number keys 135. In one particular example, the number keys 135 can be set in a 4×3 grid, and the letter keys 145 can be arranged in accordance with rows 155 that can be non-orthogonal with respect to the columns 150. For example, the letter keys 145 can be positioned along curved paths 160 between the number keys 135. This configuration enables the keypad 115 to include both independent number keys 135 and letter keys 145 in a constrained space. That is, the curved paths 160 efficiently fill in the real estate between the number keys 135.

In one particular embodiment, each of the rows 155 begins above a number key 135 and slopes downward such that the rows 155 have a midpoint below a second number key 135. For example, the first letter key 145 in the upper left portion of the keypad 115 is associated with the letters "QW" and this key 145 begins substantially over the center of the number key 135 that is associated with the number "1". The next two letter keys 145, which are respectively associated with the letters "E" and "RT", transition to a downward slope until the end of the key 145 associated with "RT" is positioned substantially below the center of the number key 135 corresponding to the number "2". In one arrangement, the positioning of the letter keys 145 associated with the letters "QW", "E" and "RT" is mirrored by the placement of the letter keys 145 associated with the letters "PO", "I" and "UY" (from right to left). That is, the beginning of the letter key 145 with the letters "PO" is positioned substantially above the center of the number key 135 with the number 3 and this letter key 145 begins a downward transition moving from right to left. Additionally, the next letter key 145, which is associated with the letter "I", continues the downward slope. This downward slope then levels off with the letter key 145 associated with the letters "UY", and the end of this letter key 145 can be positioned substantially below the center of the number key 135 associated with the number "2". The remaining rows 155 can follow a similar pattern.

In another embodiment, the letter keys 145 of the second group 140 define a QWERTY-type arrangement, such as what is shown in FIG. 1A. Of course, the keypad 115 is not limited to any particular layout, as other configurations, like a Dvorak Simplified Keyboard or an alphabetic keyboard, may be used. In the exemplary layout of FIG. 1B, there are twelve number keys 135 in the 4×3 grid, one each for the numbers zero through nine and for the pound and star signs. Moreover, a portion of the letter keys 145 can have multiple letters or characters mapped to them. In this arrangement, some of the letter keys 145 may display a single letter or character. Because many of the letter keys 145 include single letters or characters, the amount of multi-tapping can be limited. Multi-tapping can also be reduced in this design because the letter keys 145 that have multiple letters or characters can limit the number of letters or characters to two.

For those letter keys 145 that do contain multiple letters or characters, predictive text or other disambiguation techniques can be used to also minimize multi-tapping. In these processes, predictive entries can be generated among the multiple letters or characters that are mapped to a letter key 145 when the letter key 145 is activated. It is understood that the number keys 135 of this keypad 115 and other keypads presented herein are not limited to a 4×3 pattern, as other suitable grids can be used. Further, the number keys 135 can include multiple numbers, and predictive text or a disambiguation process can be used in this situation.

In one arrangement, one of the columns 150 can be a center column 165 that can divide or separate the second group 140 of letter keys 145 into two sets of letter keys 145. A first set 170 can be designed for interaction with the left hand of an operator. In addition, a second set 175 of letter keys 145 can be designed for interaction with the right hand of the operator. This interaction can be with a finger of the operator or some other component that is designed for use with a keypad. It is understood, however, that this description is not so limited, as the two sets 170, 175 of letter keys 145 can be used by either hand of an operator.

Figure 1B:
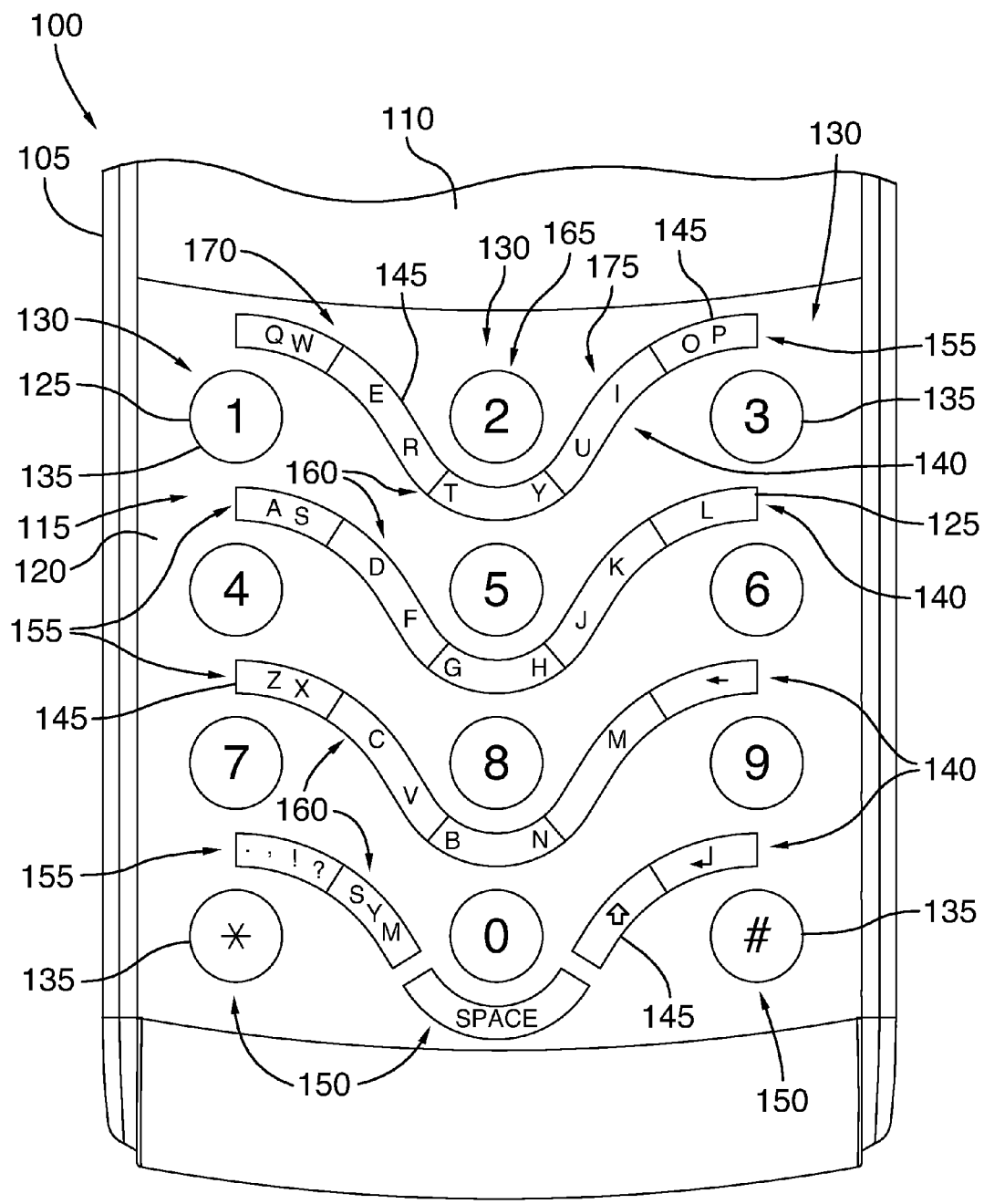
FIG. 1B illustrated the mobile device of FIG. 1A having another example keypad.

Additionally, the arrangement of the letter keys 145 can be in accordance with predetermined positioning based on optimal character entry efficiency, such as that realized with a disambiguation keypad and associated disambiguation engine. An example of such a configuration is illustrated in FIG. 1B. The arrangement of letter keys 145 in FIG. 1B includes two letters per key in the first row. In the second and third rows of letter keys 145, the letter keys 145 all have two letters per key except for the last letter key 145 which has a single letter associated therewith. In FIG. 1B, similar to that of FIG. 1A, each of the rows 155 begins above a number key 135 and slopes downward such that the rows 155 have a midpoint below a second number key 135. For example, the first letter key 145 in the upper left portion of the keypad 115 is associated with the letters "QW" and this key 145 begins substantially over the center of the number key 135 that is associated with the number "1". The next letter key 145 is associated with the letters "ER" and transition to a downward slope. The next letter key 145 is associated with "TY" and the middle of this letter key is positioned substantially below the center of the number key 135 corresponding to the number "2". In one arrangement, the positioning of the letter keys 145 associated with the letters "QW", "ER" is mirrored by the placement of the letter keys 145 associated with the letters "PO", "IU" (from right to left). That is, the beginning of the letter key 145 with the letters "PO" is positioned substantially above the center of the number key 135 with the number 3 and this letter key 145 begins a downward transition moving from right to left. Additionally, the next letter key 145, which is associated with the letter "IU", continues the downward slope. This downward slope then levels off with the letter key 145 associated with the letters "YT", and the middle of this letter key 145 can be positioned substantially below the center of the number key 135 associated with the number "2". The remaining rows 155 can follow a similar pattern.

Figure 2:
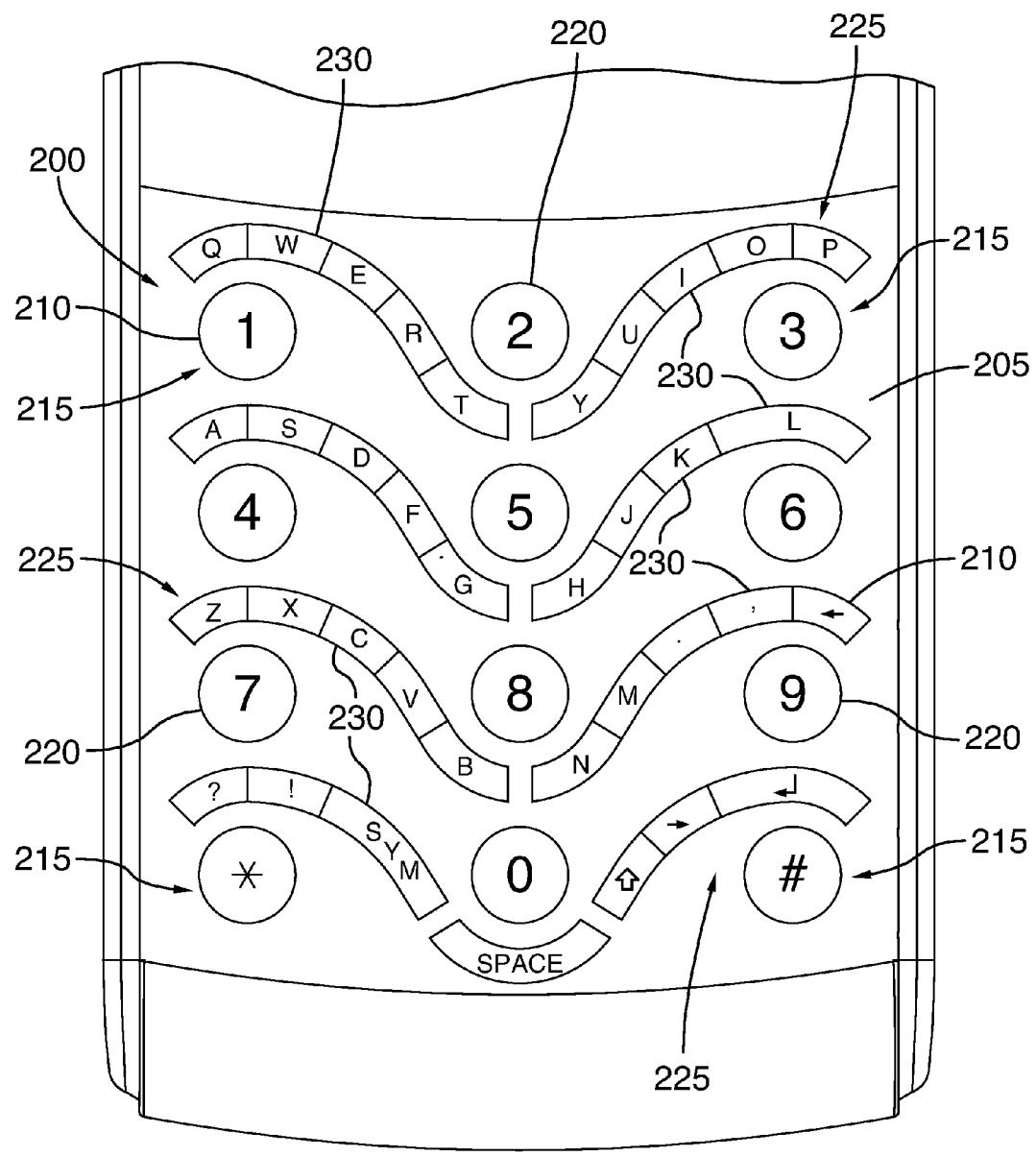
FIG. 2 illustrates the mobile device of FIG. 1A having another example keypad.

Referring to FIG. 2, the mobile device 100 is shown with another exemplary keypad 200. Similar to the layout pictured in FIG. 1, the keypad 200 can include a base surface 205 and a plurality of keys 210 comprised of a first group 215 of number keys 220 and a second group 225 of letter keys 230. Also like the keypad 115, the number keys 220 can be arranged in columns in a 4×3 grid with the letter keys 230 positioned between the number keys 220. Here, however, the number of letter keys 230 having a single letter or character mapped to them can be increased, which can further reduce the need for multi-tap. Of course, if some of the letter keys 230 include multiple letters or characters, predictive text or other disambiguation processes can be employed to limit multi-tap.

Although the pattern is relatively similar to that of FIG. 1A, the keypad 200 can accommodate the additional keys 210 because the keys 210 on the outer edges can wrap farther around the number keys 220. For example, the beginning of the letter key 230 associated with the letter "Q" begins beyond the center of the number key 220 corresponding to the number 1. Moreover, this particular letter key 230 begins an upward slope before the next letter key 230, associated with the letter "W", transitions to a downward direction. Like that of FIG. 1A, the structure of the keys 210 on the left is mirrored by those on the right. In addition, the letter keys 230 can be wrapped around the number keys 220 to a deeper degree, up to an including a configuration of completely circumnavigating the number keys 220.

Figure 3:
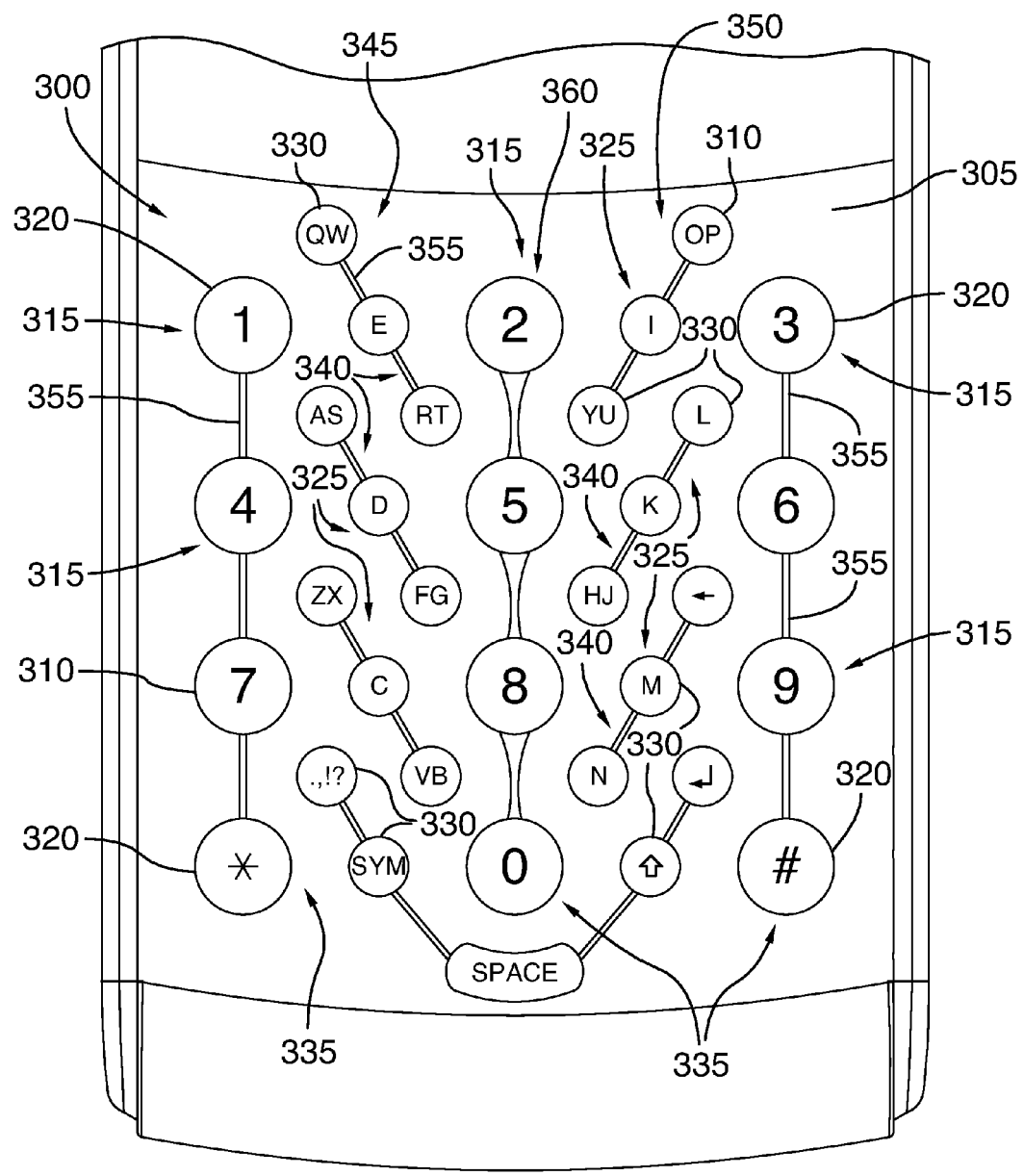
FIG. 3 illustrates the mobile device of FIG. 1A having another example keypad.

Referring to FIG. 3, the mobile device 100 is shown with yet another exemplary keypad 300. In this example, the keypad 300 can include a base surface 305 and a plurality of keys 310. The keys 310 can be comprised of a first group 315 of number keys 320 and a second group 325 of letter keys 330. Like the embodiments described above, the number keys 320 here can be arranged in accordance with a 4×3 grid, and the letter keys 330 can be positioned between the number keys 320. Moreover, the number keys 320 can be placed in columns 335. Here, however, the letter keys 330 can be positioned along slanted paths 340 between the number keys 320. The slanted paths 340 can define rows that can be non-orthogonal with respect to the columns 335. In view of this arrangement, the number keys 320 and the letter keys 330 can be operated or activated independent of one another, which can increase the effectiveness of the keypad 300 yet can minimize the amount of space required for the keypad 300.

For example, the slanted path 340 in the upper left of the keypad 300 includes the letter keys 330 that are associated with the letters "QW", "E" and "RT" and has a negative slope (moving from left to right). Similarly, the slanted path 340 in the upper right of the keypad 300 includes letter keys 330 that are associated with the letters "PO", "I" and "UY" and also has a negative slope (moving from right to left), thereby mirroring the path 340 in the upper left. This pattern can be repeated by the remaining slanted paths 340.

The slanted path 340 can be positioned at various angles with respect to the bottom of the mobile device 100. It is understood, however, that the slanted paths 340 are not limited to the same angle with respect to one another or even between the letter keys 330 of a particular path 340. In addition, for improved space utilization, the top letter keys 330—in this case, those that correspond to the letters "QW" and "PO"—are positioned above the topmost number keys 320, those that are associated with the numbers "1", "2" and "3". Likewise, one or more letter keys 330 can extend below the number keys 320, such as the letter key 330 designated as the "SPACE" bar positioned below the number keys 320 associated with the symbols "*", "0" and "#". The letter keys 330 of each of the slanted paths 340 can be positioned a substantially equal distance apart from one another. Alternatively, the letter keys 330 can be positioned apart from one another at varying distances.

Like the embodiments of FIGS. 1 and 2, the keypad 300 of FIG. 3 defines a QWERTY layout, although other arrangements are certainly possible. The SureType configuration referenced earlier can also be implemented in the arrangement of FIG. 3. In addition, some of the letter keys 330 may include more than one letter or character mapped to them, and as such, predictive text and other disambiguation techniques can be used to minimize multi-tapping. One of the columns 335 can also be a center column 360, which can separate the letter keys 330 into a first set 345 and a second set 350. The first set 345 can be configured for use with the left hand of an operator, and the second set 350 can be designed for use with the right hand of the operator. As noted earlier, this description is not limited, and either hand of an operator can access the first set 345 or the second set 350. Further, an operator can use something other than his or her hand to operate the letter keys 330.

Figure 4:
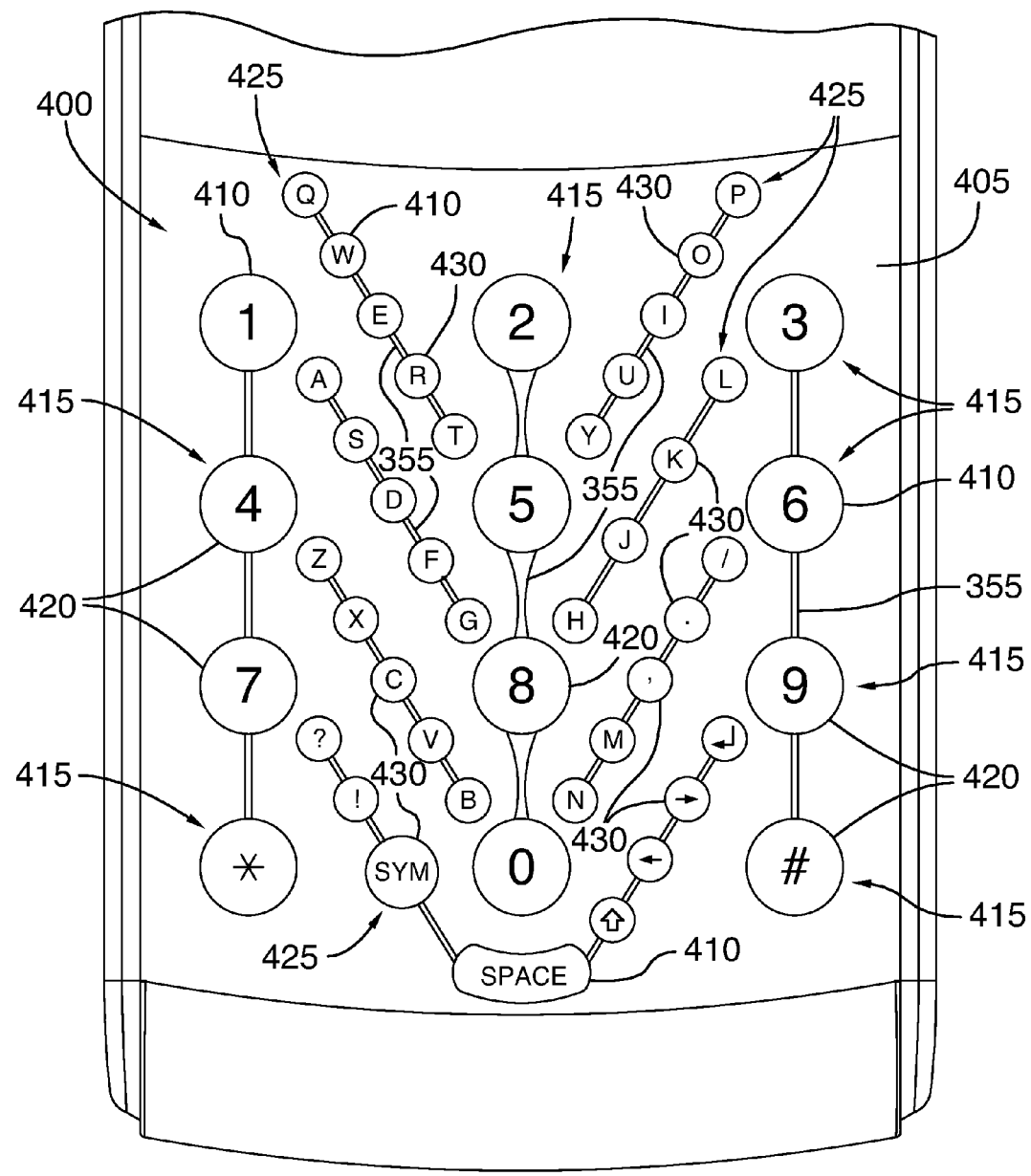
FIG. 4 illustrates the mobile device of FIG. 1A having yet another exemplary keypad.

Referring to FIG. 4, a keypad 400 is shown that can further minimize multi-tapping in relation to the embodiment of FIG. 3. In this arrangement, the keypad 400 can include a base surface 405 and a number of keys 410. The keys 410 can comprise a first group 415 of number keys 420 and a second group 425 of letter keys 430 that are positioned similar to the configuration of keypad 300 of FIG. 3. The keypad 400, however, can include a greater number of letter keys 430 having one letter or character mapped to them in comparison to the keypad 300 of FIG. 3. If necessary, predictive text or other disambiguation processes can also be employed for the keypad 400.

To accommodate the additional letter keys 430 in comparison to the keypad 300, the slanted paths can extend farther beyond the upper and lower number keys 420. For example, the letter keys 430 associated with the letters "Q" and "P" extend farther above the number keys 420 associated with the numbers "1" and "3" in comparison to the layout of FIG. 3. Also, the letter keys 430 can be positioned closer to one another along the slanted paths to allow for the additional letter keys 430. As another option, the angles of the slanted paths can also be adjusted to optimize the use of space on the keypad 400.

Referring to the keypads 300, 400 of FIGS. 3 and 4, one or more markers 355 can be positioned on the base surface 305, 405 and can traverse between the keys 310, 410. The markers 355 can help an operator distinguish between the number keys 320, 420 of the first group 315, 415 and the letter keys 330, 430 of the second group 325, 425. In other words, the markers 355 can visually couple the letter keys 330, 430 to one another and the number keys 320, 420 to one another. In one arrangement, the markers 355 can be etched into, displayed on or printed on the base surface 305, 405. In another arrangement, the markers 355 can define slots that emit light. The word "marker" is defined as a visually detectable component that serves to assist in distinguishing between certain keys on a keypad.

It is also understood that any of the keypads 100, 200, 300, 400 of FIGS. 1-4 may be constructed such that the at least some of the keys 125, 210, 310, 410 follow a generally upward slope or a generally downward slope, in addition to the previously described curved or slanted surfaces. For example, the number keys 135, 220 of FIGS. 1 and 2, respectively, may follow a trajectory that resembles a smile. In particular, the number keys 135, 220 inscribed with the numbers "1" and "3" are positioned higher than the number key 135, 200 associated with the number "2". This configuration can apply to the remaining number keys 135, 220, and the overall pattern can represent several upward curves for the number keys 135, 220. In another implementation, the number keys 135, 220 follow a downward trajectory. For example, the number keys 135, 220 associated with the numbers "1" and "3" are positioned lower than the number keys 135, 220 associated with the number "2". This configuration can apply to the remaining number keys 135, 200 such that the rows of number keys 135, 220 follow downward curves, which are representative of a frown.

A similar configuration is implementable in the keypads 300, 400 of FIGS. 3 and 4. That is, the number keys 320, 420 can follow curves with upward or downward trajectories. Moreover, the letter keys 330, 430 of these keypads 300, 400 can follow such trajectories. For example, the slants between letter keys 330, 430 become steeper or less inclined, depending on whether upward or downward trajectories are selected. As a particular but non-limiting example, the marker 355 between the letter keys 330 containing the letters "QW" and "E" is steeper than the marker 355 between the letter keys 330 associated with the letters "E" and "RT". The same design can apply to the markers 355 between the letter keys 330 associated with the letters "OP", "I" and "YU". This example produces a pattern that is representative of a smile. Alternatively, the markers 355 between the letter keys 330 positioned higher are not as steep as those positioned lower, which results in a pattern that resembles more of a frown design.

While FIGS. 1-4 primarily describe physical keypads, it is important to note that the subject matter is not so limited. For example, the principles described herein may apply to a keypad that is displayed on a touchscreen (not shown) or a virtual keypad that is projected onto a flat surface (not shown). In addition, the keys presented above are not necessarily limited to keys that are pressed by an operator to effect a corresponding action on a mobile device. For example, the keys may be activated by an operator simply placing his or her finger (or some other component) above the key and performing some predetermined action to cause the key to activate. In fact, any suitable process can be executed to activate a particular key.

Figure 5:
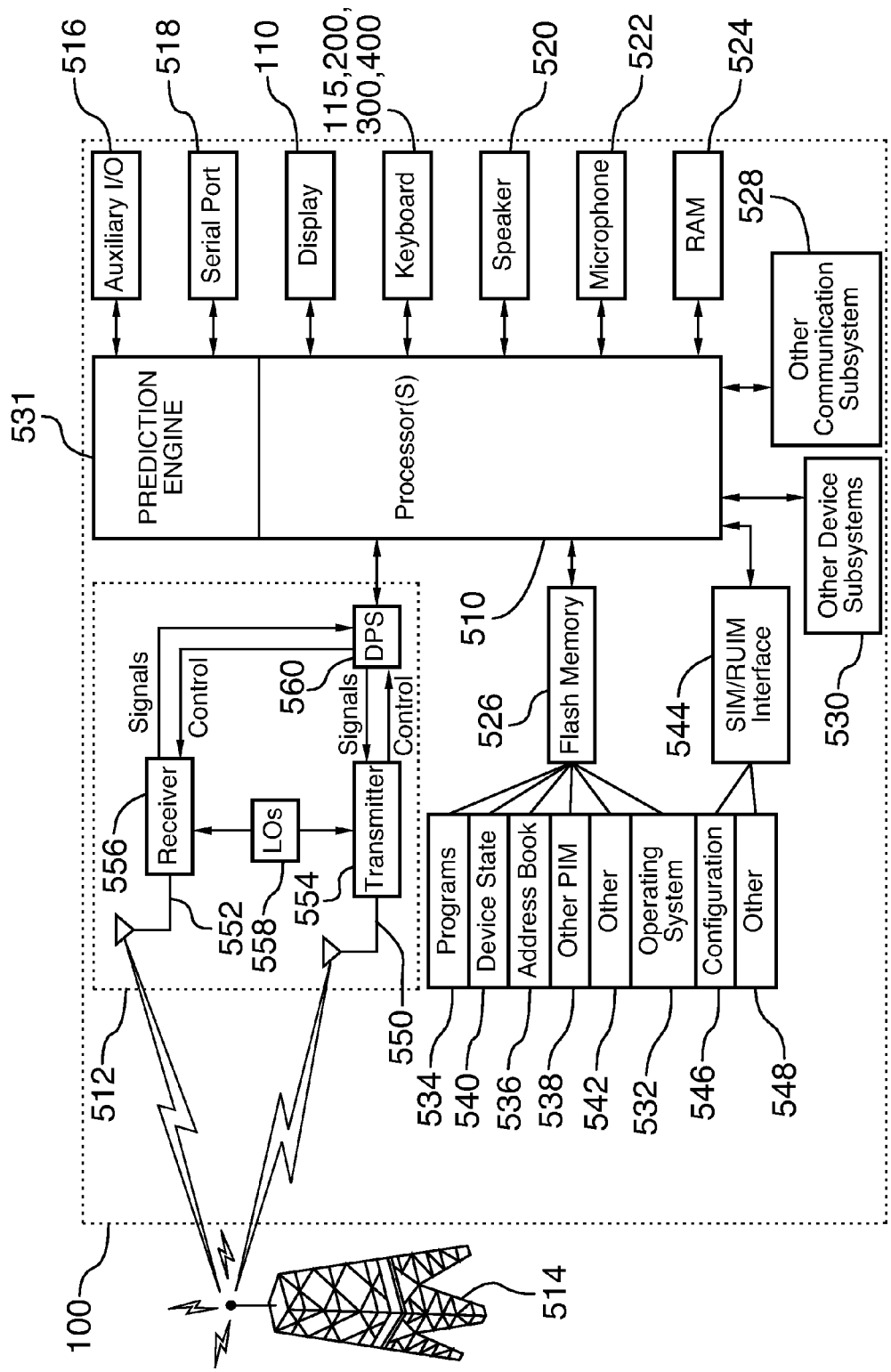
FIG. 5 illustrates a block diagram of several of the components of the example mobile device of FIG. 1A.

Referring to FIG. 5, an example of a block diagram of some of the components that make up the mobile device 100 is shown. The mobile device 100 can include a processor 510 that can control the operation of the mobile device 100. A communication subsystem 512 can perform all communication transmission and reception with a wireless network 514. The processor 510 can further be coupled to an auxiliary input/output (I/O) subsystem 516, which can be coupled to the mobile device 100. In at least one embodiment, the processor 510 can be coupled to a serial port (for example, a Universal Serial Bus port) 518, which can allow for communication with other devices or systems. The display 110 can be coupled to the processor 510 to allow for displaying of information to an operator of the mobile device 100. The keypad 115, 200, 300, 400 (or keyboard) can also be coupled to the processor 510.

The mobile device 100 can include a speaker 520, a microphone 522, random access memory (RAM) 524 and flash memory 526, all of which can be coupled to the processor 510. Other similar components can be provided on the mobile device 100 and optionally coupled to the processor 510. Other communication subsystems 528 and other communication device subsystems 530 are generally indicated as being functionally coupled with the processor 510, as well. An example of a communication subsystem 528 is that of a short range communication system, such as a BLUETOOTH® communication module or a WI-FI® communication module (a communication module in compliance with IEEE 802.11 set of protocols) and associated circuits and components.

The processor 510 is able to perform operating system functions and can enable execution of programs on the mobile device 100. In some embodiments, not all of the above components may be included in the mobile device 100. For example, in at least one embodiment, the keypad 115, 200, 300, 400 is not provided as a separate component and is displayed as required on a dynamic touch display. In an embodiment having a dynamic touch display, the keypad 115, 200, 300, 400 can be displayed as a touchscreen keypad (not shown). A touchscreen module (not shown) can be incorporated in such an embodiment such that it is in communication with the processor 510. When inputs are received on the touchscreen keypad, the touchscreen module can send or relay messages corresponding to those inputs to the processor 510.

In one embodiment, the processor 510 may include a prediction engine 531. The prediction engine 531 can be operable to generate predictive letter entries among multiple letters that are mapped to a key when that key is activated. Although shown as part of the processor 510, the prediction engine 531 may be a separate component or may be part of any of the other components shown in FIG. 5.

The auxiliary I/O subsystem 516 can take the form of a navigation tool, such as an optical trackpad, a thumbwheel, a mechanical trackball, a joystick, a touch-sensitive interface, or some other I/O interface. Other auxiliary I/O subsystems can include external display devices and externally connected keyboards (not shown). While the above examples have been provided in relation to the auxiliary I/O subsystem 516, other subsystems capable of providing input or receiving output from the mobile device 100 are considered within the scope of this disclosure. Other keys or buttons can be placed along the side of the mobile device 100 to function as escape keys, volume control keys, scrolling keys, power switches, or user programmable keys, and can likewise be programmed accordingly.

Furthermore, the mobile device 100 can be equipped with components to enable operation of various programs, as shown in FIG. 5. In an exemplary embodiment, the flash memory 526 can be enabled to provide a storage location for an operating system 532, device programs 534 and data. The operating system 532 can generally be configured to manage other programs 534 that are also stored in flash memory 526 and executable on the processor 510. The operating system 532 can honor requests for services made by programs 534 through predefined program 534 interfaces. More specifically, the operating system 532 can typically determine the order in which multiple programs 534 are executed on the processor 510 and the execution time allotted for each program 534, manage the sharing of flash memory 526 among multiple programs 534, handle input and output to and from other device subsystems 530, and so on. In addition, operators can typically interact directly with the operating system 532 through a user interface, which can include the display 110 and the keypad 115, 200, 300, 400. While in an exemplary embodiment, the operating system 532 is stored in flash memory 526, the operating system 532 in other embodiments is stored in read-only memory (ROM) or a similar storage element (not shown). As those skilled in the art will appreciate, the operating system 532, the device program 534 or parts thereof can be loaded in RAM 524 or some other volatile memory.

In one exemplary embodiment, the flash memory 526 can contain programs 534 for execution on the mobile device 100 including an address book 536, a personal information manager (PIM) 538 and the device state 540. Furthermore, programs 534 and other information 542 including data can be segregated upon storage in the flash memory 526 of the mobile device 100.

When the mobile device 100 is enabled for two-way communication within the wireless communication network 514, it can send and receive messages from a mobile communication service. Examples of communication systems enabled for two-way communication can include, but are not limited to, the General Packet Radio Service (GPRS) network, the Universal Mobile Telecommunication Service (UMTS) network, the Enhanced Data for Global Evolution (EDGE) network, the Code Division Multiple Access (CDMA) network, High-Speed Packet Access (HSPA) networks, Universal Mobile Telecommunication Service Time Division Duplexing (UMTS-TDD), Ultra Mobile Broadband (UMB) networks, Worldwide Interoperability for Microwave Access (WiMAX) networks, Long Term Evolution (LTE) networks and other networks that can be used for data and voice, or just data or voice.

For the systems listed above, the mobile device 100 can require a unique identifier to enable the mobile device 100 to transmit and receive messages from the communication network 514. Other systems may not require such identifying information. As an example, GPRS, UMTS, and EDGE use a Subscriber Identity Module (SIM) in order to allow communication with the communication network 514. Likewise, most CDMA systems use a Removable User Identity Module (RUIM) to communicate with the CDMA network. The RUIM and SIM card can be used in multiple different mobile devices 100. The mobile device 100 can be able to operate some features without a SIM/RUIM card. A SIM/RUIM interface 544 located within the mobile device 100 can allow for removal or insertion of a SIM/RUIM card (not shown). The SIM/RUIM card can feature memory and can hold key configurations 546, and other information 548, such as identification and subscriber related information. With a properly enabled mobile device 100, two-way communication between the mobile device 100 and communication network 514 is possible.

The two-way communication enabled mobile device 100 can both transmit and receive information from the communication network 514. The transfer of communication can be from the mobile device 100 or to the mobile device 100. To communicate with the communication network 514, the mobile device 100 in the presently described exemplary embodiment is equipped with an integral or internal antenna 550 for transmitting messages to the communication network 514. Likewise, the mobile device 100 in the presently described exemplary embodiment can be equipped with another antenna 552 for receiving communication from the communication network 514. These antennae (550, 552), in another exemplary embodiment, can be combined into a single antenna (not shown). As one skilled in the art would appreciate, the antenna or antennae (550, 552) in another embodiment can be externally mounted on the mobile device 100. The mobile device 100 can also have a transmitter 554 and a receiver 556, which can be respectively coupled to antennae (550, 552), and can also include one or more local oscillators 558 for processing the incoming or outgoing RF signals. The mobile device 100 can also have a digital signal processor (DSP) 560 to assist in the processing of the incoming and outgoing signals.

Figure 6:
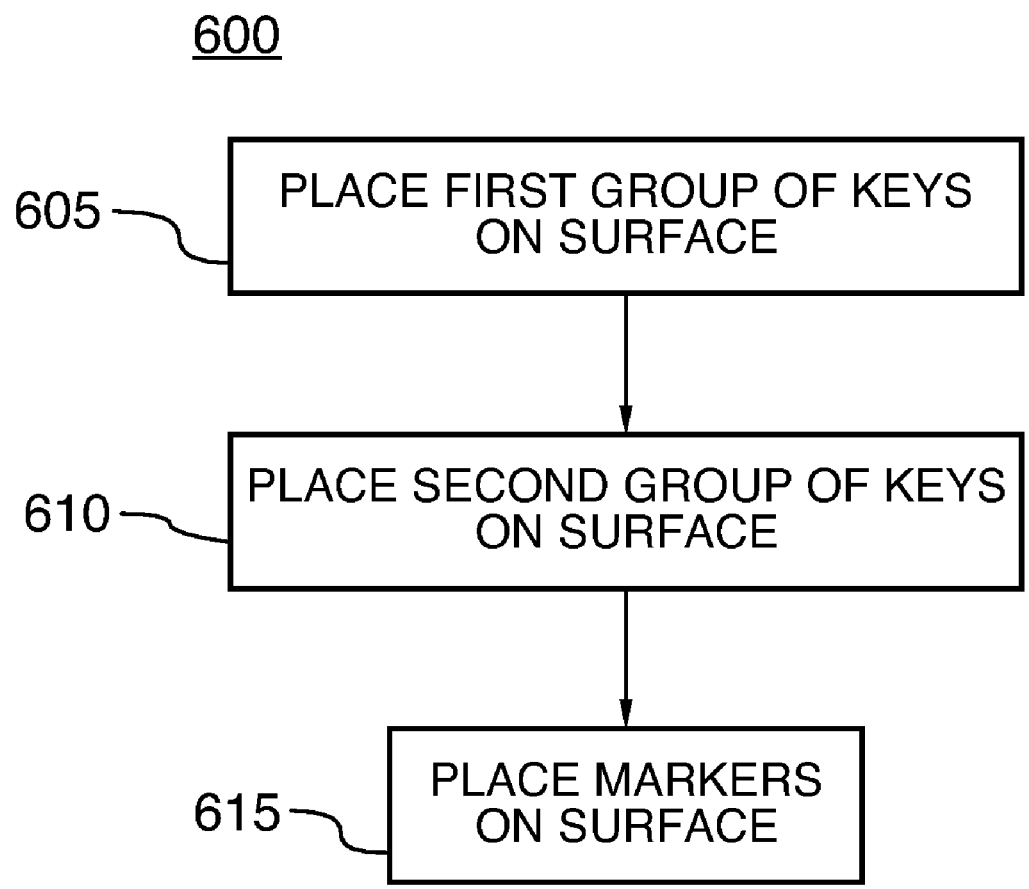
FIG. 6 illustrates a method of assembling a keypad according to the present disclosure.

Referring to FIG. 6, a method 600 of assembling a keypad is shown. At step 605, a first group of keys can be placed on a surface, and the keys of the first group can be configured for enabling initiation of a voice call. At step 610, a second group of keys can be placed on the surface, and the keys of the second group can be configured for enabling text entry. The first group of keys and the second group of keys can be independent of one another. The process of placing the keys on the surface can include physically placing the keys on a surface or assembling a touchscreen module to display the keys. Also, the first group of keys and the second group of keys can be part of the same assembly and can be manufactured simultaneously or successively.

In one arrangement, placing the first group of keys can include positioning the first group of keys in a number of columns. Additionally, placing the second group of keys can include positioning the second group of keys in areas between the columns. The method 600 can also include the step 615 of placing markers on the surface. The markers can visually connect the first group of keys with one another and the second group of keys with one another.

Portions of the mobile device 100 and supporting components can take the form of hardware elements, software elements or elements containing both hardware and software. In one embodiment, the software portions can include, but are not limited to, firmware, resident software, microcode, etc. Furthermore, these software portions can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium (though propagation mediums in and of themselves as signal carriers are not included in the definition of physical computer-readable medium). Examples of a physical computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD. Both processors and program code for implementing each as aspect of the system can be centralized or distributed (or a combination thereof) as known to those skilled in the art.

A data processing system suitable for storing program code and for executing program code, which can be implemented in any of the above-referenced devices described herein, can include at least one processor coupled directly or indirectly to memory elements through a system bus. The memory elements can include local memory employed during actual execution of the program code, bulk storage, and cache memories that provide temporary storage of at least some program code in order to reduce the number of times code must be retrieved from bulk storage during execution. I/O devices (including but not limited to keyboards, displays, pointing devices, etc.) can be coupled to the system either directly or through intervening I/O controllers.

Examples have been described above regarding a keypad and method of assembly of same. Various modifications to and departures from the disclosed embodiments will occur to those having skill in the art. The subject matter that is intended to be within the spirit of this disclosure is set forth in the following claims.

What is claimed is:
1. A keypad, comprising:
a base surface; and
a plurality of keys positioned on the base surface,
wherein the plurality of keys are comprised of a first group that is an arrangement of number keys for initiating a voice-based communication and a second group that is an arrangement of letter keys;
wherein the number keys of the first group and the letter keys of the second group are independent of one another;
the number keys of the first group are positioned on the base surface in a number of columns and the letter keys of the second group are positioned in areas between the number keys; and
the letter keys of the second group are further positioned along slanted or curved paths between the number keys.

2. The keypad according to claim 1, further comprising markers that are placed on the base surface and traverse between the keys to distinguish the number keys of the first group from the letter keys of the second group.

3. The keypad according to claim 2, wherein the markers are etched into or printed on the base surface.

4. The keypad according to claim 1, wherein one of the columns is a center column that divides the second group of letter keys into two sets of letter keys, wherein a first set of letter keys is designed for interaction with a finger of the left hand of an operator and the second set of letter keys is designed for interaction with a finger of the right hand of the operator.

5. The keypad according to claim 1, wherein the letter keys define a QWERTY-type arrangement.

6. The keypad according to claim 5, wherein a portion of the letter keys have multiple letters mapped to them.

7. A mobile device, comprising:
a housing; and
a keypad that is assembled into the housing, wherein the keypad includes a base surface and a plurality of keys,
wherein the plurality of keys are comprised of a first group corresponding to number keys associated with a dialing function of the mobile device and a second group corresponding to letter keys associated with a text entry function of the mobile device;
the number keys of the first group and the letter keys of the second group are independent of one another and the letter keys are positioned between the number keys; and
the number keys are arranged in accordance with a 3×4 grid and are positioned in columns and the letter keys are arranged in accordance with rows that are non-orthogonal with respect to the columns.

8. The mobile device according to claim 7, further comprising markers for visually coupling letter keys to one another and number keys to one another.

9. The mobile device according to claim 8, wherein the markers are etched into or printed on the keypad.

10. The mobile device according to claim 7, wherein one of the columns is a center column that separates the letter keys into two sets, wherein one set is designed for use with the left hand of an operator and the other set is designed for use with the right hand of the operator.

11. The mobile device according to claim 7, wherein the letter keys define a QWERTY-type arrangement.

12. The mobile device according to claim 11, wherein a portion of the letter keys have multiple letters mapped to them.

13. The mobile device according to claim 12, further comprising a prediction engine, wherein the prediction engine is operable to generate predictive letter entries among multiple letters that are mapped to a letter key when that key is activated.

14. A method of assembling a keypad, comprising:
placing a first group of keys on a surface, wherein the keys of the first group are configured for enabling initiation of a voice call; and
placing a second group of keys on the surface, wherein the keys of the second group are configured for enabling text entry; and
placing markers on the surface to visually connect the first group of keys with one another and the second group of keys with one another,
wherein the first group of keys and the second group of keys are independent of one another; and
placing the first group of keys comprises positioning the first group of keys in a number of columns and placing the second group of keys comprises positioning the second group of keys in areas between the columns.

* * * * *